(12) United States Patent
Kappler

(10) Patent No.: US 7,862,661 B2
(45) Date of Patent: Jan. 4, 2011

(54) DEVICE AND METHOD FOR TREATING THE SURFACES OF SUBSTRATES

(75) Inventor: Heinz Kappler, Dornstetten-Aach (DE)

(73) Assignee: Gebr. Schmid GmbH & Co. (DE)

( * ) Notice: Subject to any disclaimer, the term of this patent is extended or adjusted under 35 U.S.C. 154(b) by 0 days.

(21) Appl. No.: 12/138,125

(22) Filed: Jun. 12, 2008

(65) Prior Publication Data

US 2008/0241378 A1 Oct. 2, 2008

Related U.S. Application Data

(63) Continuation of application No. PCT/EP2006/012117, filed on Dec. 15, 2006.

(30) Foreign Application Priority Data

Dec. 16, 2005 (DE) .................. 10 2005 062 527

(51) Int. Cl.
*B05D 1/28* (2006.01)
(52) U.S. Cl. ............... 134/15; 134/21; 427/350
(58) Field of Classification Search .............. 427/350; 134/15, 21; 118/225, 223, 255
See application file for complete search history.

(56) References Cited

U.S. PATENT DOCUMENTS

| | | | |
|---|---|---|---|
| 3,826,228 A * | 7/1974 | Glover | 118/255 |
| 4,503,802 A | 3/1985 | Keller et al. | |
| 4,562,099 A | 12/1985 | Hinchcliffe | |
| 5,232,501 A | 8/1993 | Pender et al. | |
| 5,569,326 A | 10/1996 | Ruhl | |
| 5,674,020 A | 10/1997 | Kimura et al. | |
| 5,820,673 A | 10/1998 | Sentilles et al. | |
| 5,863,328 A | 1/1999 | Sichman et al. | |
| 6,171,653 B1 * | 1/2001 | Kohl et al. | 427/377 |
| 6,489,394 B1 | 12/2002 | Andros | |
| 6,740,170 B2 | 5/2004 | Yoshimura et al. | |
| 6,794,300 B1 * | 9/2004 | Hillman | 438/710 |

FOREIGN PATENT DOCUMENTS

| | | |
|---|---|---|
| AU | 3687671 A | 6/1973 |
| DE | 2004706 A1 | 8/1971 |

(Continued)

OTHER PUBLICATIONS

Office Action dated May 12, 2009 issued in co-pending U.S. Appl. No. 12/139,317.

*Primary Examiner*—Michael Kornakov
*Assistant Examiner*—Natasha Campbell
(74) *Attorney, Agent, or Firm*—Akerman Senterfitt

(57) ABSTRACT

The invention relates to a device for treating the surfaces of silicon wafers, comprising transport rollers for transporting the silicon wafer, and at least one conveyor device which wets the surface of the silicon wafer with an aqueous medium on a transport plane which is determined by the transport rollers. The conveyor device is configured such that it can apply the process medium to the surface of the silicon wafer, which is oriented in a downward manner and which is arranged on the transport plane. Several suction pipes for suctioning gaseous or mist-like distributed process mediums from the area surrounding the conveyor device are provided. The suction pipes are arranged in the vertical direction below the transport plane.

4 Claims, 2 Drawing Sheets

FOREIGN PATENT DOCUMENTS

| | | |
|---|---|---|
| DE | 8907704 U1 | 8/1989 |
| DE | 3813518 A1 | 11/1989 |
| DE | 3816614 A1 | 11/1989 |
| DE | 19516032 A1 | 11/1996 |
| DE | 19633741 A1 | 3/1998 |
| DE | 19916762 A1 | 11/2000 |
| DE | 20010388 U1 | 10/2001 |
| EP | 1015136 B1 | 5/2000 |
| GB | 1269510 * | 4/1972 |
| GB | 1269510 A | 4/1972 |
| JP | 5-317768 A | 12/1993 |

\* cited by examiner

DEVICE AND METHOD FOR TREATING THE SURFACES OF SUBSTRATES

FIELD OF APPLICATION AND PRIOR ART

The invention relates to a device for the surface treatment of substrates, having at least one transport means for transporting an in particular silicon material substrate and having at least one conveying means, which is provided for wetting a substrate surface with a liquid, gaseous or spray-like process medium in a transport plane defined by the transport means. The invention also relates to a method for wetting a substrate surface of an in particular silicon material substrate with a process medium.

DE 102 25 848 A1 discloses a device used for the removal of a coating from a top surface of a flat substrate. A solvent is then sprayed by nozzles inclined from above onto the substrates. The substrates are located on transport shafts and are transported by the latter. At least a lateral end of the substrates projects above the transport shafts, so that the solvent flowing off the substrate and which contains the detached coating constituents as a result of the projecting length of the substrates flows past the transport means. This is intended to prevent a contamination of the transport means. The coating removal using the solvent serves to remove photoactive coatings prior to an etching process to ensure that only exposed and developed surface areas of the substrates are provided with a protective coating effective for the etching process. Thus, the coatings have already been structured as a result of the exposure and development of the photoactive coatings.

In other surface treatment processes, particularly for coating removal and which are carried out on substrates, for example on silicon disks or plates, known as wafers and used more specifically for the production of semiconductor components and solar cells, there can be a wetting of individual substrate surfaces with the process medium. Wetting is to take place in such a way that the remaining substrate surfaces which are not to have a protective coating in the aforementioned sense or some other coating, are not attacked by the process medium to be applied, so that a coating removal only takes place on the substrate surface wetted with the process medium. This is not ensured when using the known device.

PROBLEM AND SOLUTION

The problem of the invention is to provide a device and a method permitting a selective surface treatment of substrates.

According to a first aspect of the invention the problem is solved by a device having the features of claim 1, in which the conveying means is designed for the application of the process medium to a downwardly directed substrate surface located in the transport plane and which is provided with at least one suction means for sucking off process medium distributed in gas and/or mist form from the environment of the conveying means, the at least one suction means being positioned vertically below the transport plane. Advantageous and preferred developments of the invention form the subject matter of the further claims and are explained in greater detail hereinafter. The device and method are in part explained jointly and these explanations and the corresponding features apply both to the device and method. By express reference the wording of the claims is made into part of the content of the description.

The downwardly directed substrate surface is substantially planar and is oriented in such a way that a surface normal on said substrate surface is at least substantially perpendicular in the vertical direction. The downwardly directed substrate surface is located in the transport plane and constitutes the surface to be wetted with process medium. Further downwardly directed substrate surfaces not located in the transport plane are not, however, to be wetted with the process medium.

The transport plane is the plane in which a substrate to be transported contacts the transport means and is oriented substantially horizontally or assumes an acute angle with the horizontal. As a function of the arrangement of the transport means, the transport plane can be in the form of a curved transport surface and there is a substantially horizontal orientation of transport surface portions.

A conveyor provided for wetting a downwardly directed substrate surface with process medium in the transport plane can for example be constructed as a fluid wave in the manner of a solder wave. Thus, the liquid process medium is pumped over an elongated, arcuately profiled edge, so that a downwardly projecting fluid wave is produced and contacts the transport plane in an apex.

It is also conceivable to construct the conveyor as a sprayer, which can deliver substantially vertically upwardly directed spray jets. Independently of the substrate contour a sprayer can also bring about a selective wetting of the downwardly directed substrate surfaces.

In a preferred embodiment of the invention, the process medium is to be applied in direct mechanical contact between a conveyor for example implemented as a roller or conveyor belt and the downwardly directed substrate surface. To this end the conveyor has a surface structure suitable for wetting the substrate surface and is optionally supplied with process medium by a dosing device. The conveyor is then driven or constructed in movable manner. This permits a rolling of an outer surface of the conveyor on the substrate surface for the transfer of the process medium, preferably at identical surface speeds of the substrate moved in the transportation direction and the outer surface of the conveyor contacting the transport plane.

Independently of the nature of the wetting of the downwardly directed substrate surface, process medium in gas and/or mist form can occur in the vicinity of the conveyor and this must not be undesirably deposited on other, not downwardly directed substrate surfaces. In order to prevent damage to these possibly unprotected surfaces through the process medium, suction means are provided which suck the process medium in vapour and/or mist form from the conveyor environment, thereby preventing a deposition on the other substrate surfaces. The at least one suction means is positioned beneath the transport plane in order to be able to bring about a substantially vertically downwardly directed air flow and therefore preventing an upward rise above the transport plane of process medium in vapour and/or mist form. Typical process media such as aqueous solutions of hydrofluoric acid, hydrochloric acid, nitric acid or potassium hydroxide form gases or mists which are heavier than air and which can mainly rise above the transport plane due to the relative movements between the transport means and substrates.

The transport plane is substantially horizontally oriented or assumes an acute angle to the horizontal. As a function of the arrangement of the transport means, the transport plane can be a curved transport surface, preference being given to a substantially horizontal orientation of transport surface portions. The suction means is based on the use of a vacuum, which is preferably chosen in comparison with a normal pressure in the vicinity of the conveyor in such a way that there is an at least almost turbulence-free and in particular laminated air flow in the vertical, downwards direction.

In a development of the invention the at least one suction means is placed in a gap, which is bounded by at least two adjacent transport means and the transport plane. This leads to a compact design of the substrate surface treatment device. The gaps between the transport means permit an advantageous flow of the air sucked or exhausted by the suction means and flowing away in a substantially vertical direction. By fitting suction means between the transport means it is also possible to reliably suck off directly at its formation point any excess process medium which has been transformed into a gaseous and/or mist-like state through the relative movement, particularly the rolling movement, between the substrate surface already wetted with process medium and the transport means and is consequently kept away from an area above the transport plane.

In a further development of the invention, the suction means is constructed as an elongated hollow body, particularly a pipe and is provided with at least one suction opening. This brings about a simple, inexpensive construction of the suction means. The suction means can in particular be constructed as a closed or slotted pipe cross-section and in said closed pipe cross-section there are one or more suction openings. With a slotted hollow body the slot extending along a median longitudinal axis forms the suction opening. The hollow body can in particular be constituted by plastic or metal pipes, which are for example produced in a seamless manner and are subsequently provided with the suction openings.

In a further development of the invention the suction means are located in the vicinity of a process medium-filled tank. As a result the suction means can also deal with gaseous and/or mist-like process medium, which can be present above the tank serving as a storage reservoir for the process medium. This prevents any rise of the gas and/or mist-like process medium passing out of the tank above the transport plane, so as to avoid any deposition of the process medium on an upwardly directed substrate surface.

According to another development of the invention, the suction means are placed in the tank in such a way that on an underside which is in particular free from suction openings an at least partial wetting by process medium is possible. This leads to a particularly compact design of the surface treatment device. The process medium received in the tank is conveyed via the conveyor to the substrate surfaces to be wetted. To allow a short conveying path for the process medium which is also responsible for a compact design of the device, the process medium tank is so positioned that a process medium level is only just below the transport plane. An adequate hollow cross-section must be made available for the suction means so as to ensure that suction takes place with a low to moderate flow speed for ensuring a low turbulence flow in the area above the transport plane. Thus, the preferably elongated hollow body construction of the suction means is so positioned between the tank and the transport plane that it is at least partly immersed in the process medium and it consequently not prejudicial to the desired short path for the process medium.

In a further development of the invention, with the tank is provided a suction shaft at least portionwise located on a tank edge for the marginal suction of process medium distributed in gas and/or mist form. This prevents process medium distributed in gas or mist form from rising at the tank edge above the transport plane and damaging the upwardly directed substrate surface. The suction shaft can be fitted to the edge of the tank as an at least partly circumferential, slender hollow body with at least one suction opening. In a preferred embodiment of the invention the marginal suction shaft is formed by a trough or process chamber at least portionwise surrounding the tank and which bounds a slot-like, at least substantially circumferential opening through which suction can take place in a vertical downwards direction.

In another development of the invention, the at least one suction opening of the suction means is located in an area above a median longitudinal axis of the suction means. This ensures a substantially low turbulence, particularly laminar inflow of the ambient air exhausted by the suction means. Through suction openings located above the median longitudinal axis of the suction means the substantially vertically sucked in air is not deflected in undesired manner in the vicinity of the suction means and consequently gives rise to only limited or no turbulence, which could lead to an undesired deposition of gaseous or mist-like process medium on the substrate surfaces not to be wetted.

According to a further development of the invention, the suction means are connected to a suction line and there is at least one setting valve between suction means and suction line. By connecting the suction means to a suction line it is possible to bring about a central suction and an optionally necessary central preparation of the exhausted mixture of ambient air and process medium in gas and/or mist form. The suction line can for example be provided with a central pumping mechanism for producing a vacuum, so that there is a central control, i.e. an activation and deactivation, as well as a setting of a suction volume flow for all the suction means. In order to permit an individual adaptation of a suction volume flow exhausted by the individual suction means through the suction openings, at least between a suction means and the suction line there is a setting valve, particularly in the form of a settable throttle valve, and this permits a manual or automated setting of the suction volume flow for said suction means.

In a further development of the invention the suction means is positioned between two transport means implemented as transport rollers, a median longitudinal axis of the suction means running parallel to the rotation axes of the transport means. This permits a particularly compact design of the device, because the parallel arrangement of the suction means and the transport means in the form of transport rollers brings about a space-saving arrangement. The suction means can be received in a substantially triangular or trapezoidal gap defined by the cylindrical transport rollers and the transport plane. This gap results from the cylindrical contour of the transport rollers and the spacing between said rollers necessary for a unidirectional movement thereof.

According to a second aspect of the invention the problem is also solved by a method for the wetting of a substrate surface of substrate, which in particular is of silicon material, with a process medium and having the following steps:
transporting the substrate with transport means in a transport plane,
wetting a downwardly directed substrate surface at least substantially located in the transport plane with a process medium applied to the substrate surface with a conveyor,
suction of the process medium in vapour and/or mist form with suction means positioned vertically below the transport plane in order to prevent a deposition of process medium on a substrate surface other than that located in the transport plane.

Transportation of the substrate preferably takes place in a substantially linear transportation direction in the transport plane defined by the transport means. For this purpose the substrate with the downwardly directed substrate surface is placed on an arrangement of several transport means, which are at least partly coupled to a drive mechanism, are driven by the latter and which can consequently bring about a forward movement of the substrate. In a preferred embodiment of the invention, the wetting of the downwardly directed substrate surface takes place directly through the transport means and which therefore simultaneously constitute conveyors. Additionally or alternatively the wetting can also take place through separate conveyors, which are positioned between the transport means below the transport plane. Suction or exhaustion of process medium in vapour and/or mist form is implemented by the suction means arranged vertically below the transport plane and which bring about a vertically downwardly directed air flow, so as to prevent deposition of the process medium on any substrate surface other than that located in the transport plane.

According to a development of the method, there is a continuous transportation of substrate and/or a continuous provision of process medium through the conveyor for the wetting of the substrate surface and/or a continuous suction of process medium in gas or mist form. As a result of a continuous performance of the transportation of the substrates and/or the provision of process medium for the wetting of the substrate surface and/or the suction, it is possible to ensure a working process in which there is only a minimal and preferably a negligible and with particular preference no deposition of process medium on substrate surfaces which are not to be wetted.

These and further features can be gathered from the claims, description and drawings and the individual features, both singly or in the form of subcombinations, can be implemented in an embodiment of the invention and in other fields and can represent advantageous, independently protectable constructions for which protection is claimed here. The subdivision of the application into individuals sections and the subheadings in no way restrict the general validity of the statements made thereunder.

BRIEF DESCRIPTION OF THE DRAWINGS

An embodiment of the invention is described in greater detail hereinafter relative to the diagrammatic drawings, wherein show.

DETAILED DESCRIPTION OF THE EMBODIMENTS

Figure 1:
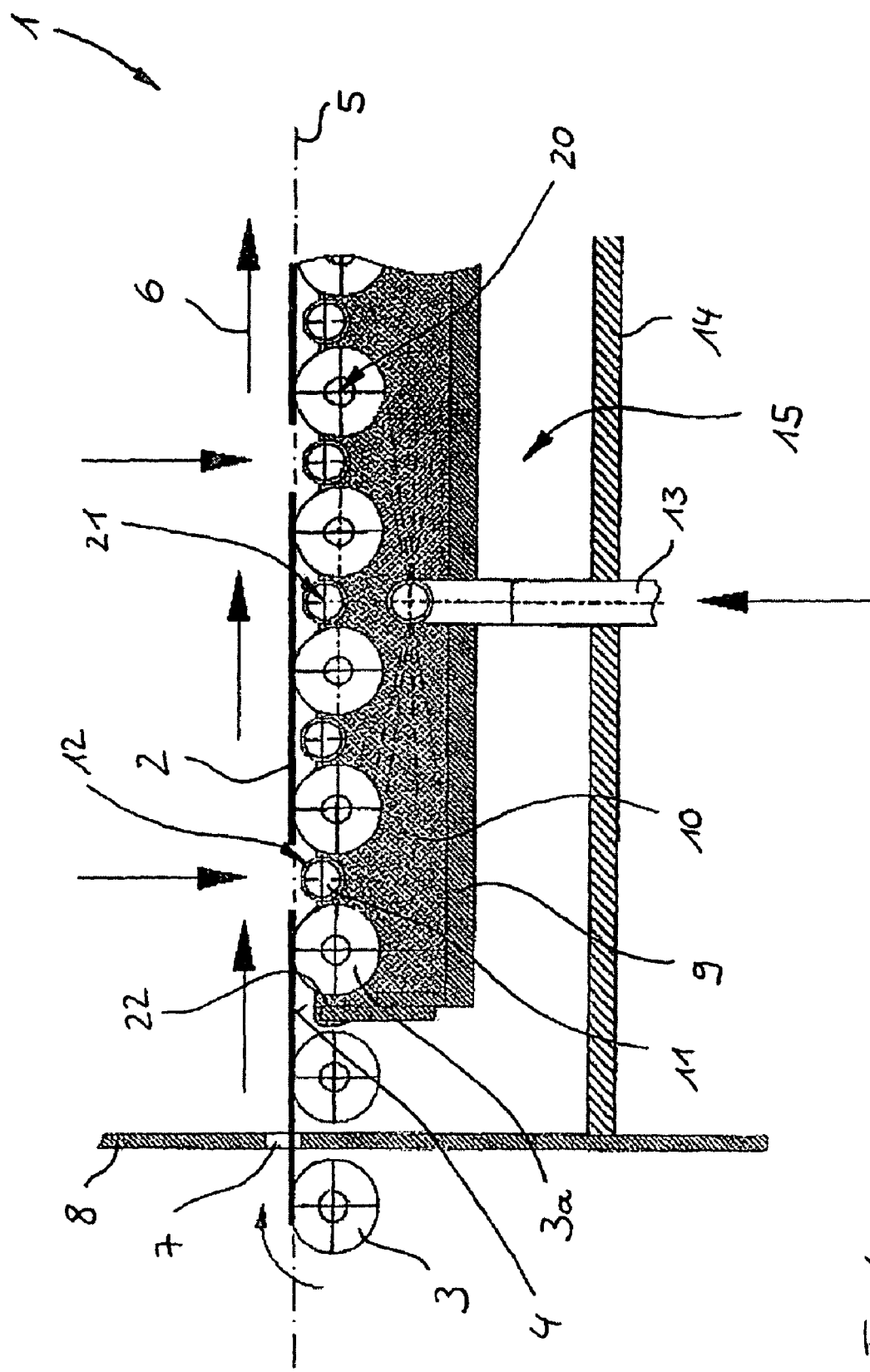
FIG. 1 A diagrammatic representation of a device for the surface treatment of substrates in a side view.
Figure 2:
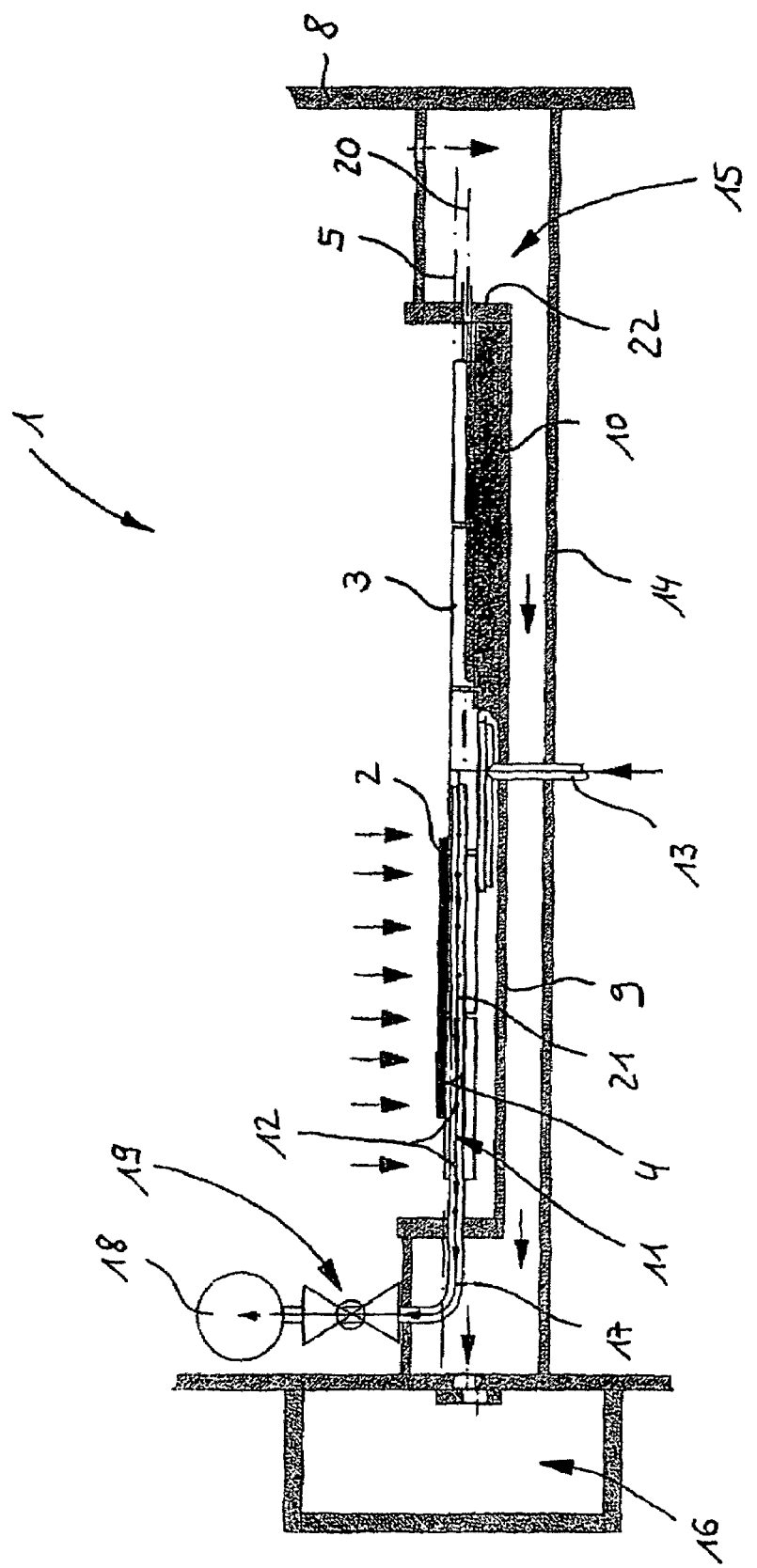
FIG. 2 A diagrammatic representation of the device of FIG. 1 in a part sectional front view.

A device 1 for the surface treatment of substrates 2 shown in FIGS. 1 and 2 has several transport means in the form of transport rollers 3, 3a. The transport rollers 3, 3a are intended for a linear transporting of substrates 2 in particular made from a silicon material. The transport rollers 3, 3a define a transport plane 5 oriented in the horizontal direction and which touches at one surface transport rollers 3, 3a. Transport rollers 3, 3a are mounted in rotary manner in device 1 and are driven at least partly by a not shown drive mechanism with a preferably constant, adjustable rotation speed.

Substrate 2 is typically a flat, planar silicon plate or wafer, which has a round contour with a diameter of approximately 60 to 250 mm or a rectangular contour with edge lengths of 60 to 250 mm. The preferred substrate thickness is 0.1 to 2 mm. By means of a downwardly directed substrate surface 4, substrate 2 rests on transport rollers 3, 3a and is moved in a transportation direction 6 by the equidirectional, identical speed rotation of transport rollers 3, 3a.

The function of device 1 can for example be to remove an in particular electrically conductive coating applied to all sides of substrate 2 on its downwardly directed surface 4 in a wet chemical process using a liquid process medium without damaging the coating applied to the remaining substrate surfaces.

For this purpose substrate 2 with substrate surface 4 is placed on transport rollers 3, 3a and moved through an intake port 7 into an almost completely closed process chamber 8 which is only intimated in the drawings. The process chamber 8 contains a tank 9 completely filled with a liquid process medium 10, particularly with aqueous solutions of hydrofluoric acid (HF(aq)) and/or hydrochloric acid (HCl(aq)) and/or nitric acid ($HNO_3$(aq)) and/or potassium hydroxide (NaOH(aq)). Tank 9 is spaced from a bottom 14 of process chamber 8, so that between the tank 9 and bottom 14 a suction shaft 15 is formed ensuring suction on the marginal area of tank 9. As shown in greater detail in FIG. 2, the suction shaft 15 extends beneath the entire tank 9 and consequently permits a sucking off of process medium 10 in vapour and/or mist form and which passes out over the edge of tank 9 and which has not been subject to the action of suction means 11. The suction shaft 15 is coupled to a spent air shaft 16 fitted laterally to the device 1 and which is subject to a vacuum action. A medium line 13 supplies fresh process medium to tank 9.

To ensure wetting of the downwardly directed substrate surface 4, the transport rollers 3a fulfil a double function, i.e. they not only serve as the transport means for substrate 2, but also as a conveyor for process medium 10. For conveying process medium 10 from tank 9 into transport plane 5, the transport rollers 3a are fitted in tank 9 in such a way that they are partially immersed in process medium 10 and a liquid level 23 is above the rotation axis 20 of the cylindrical conveyor rollers 3a. The transport rollers in the form of conveyor rollers 3a have a wettable surface, so that they can convey the process medium 10 upwards and with a limited coating thickness counter to the force of gravity into transport plane 5 and in a rolling process, i.e. in a direct, mechanical contact, can bring about a transfer to substrate surfaces 4. As the process medium only rests with a limited coating thickness on transport rollers 3a, even in the case of a limited thickness of substrates 2 it is ensured that the process medium 10 does not reach an upwardly directed substrate surface.

To ensure that the upwardly directed substrate surface remains free from process medium 10, suction means 11 are provided for the suction or exhaustion of process medium in gas and/or mist form and which can be present in the area around the transport rollers 3a acting as conveying means. The process medium 10 has a vapour pressure, so that as a function of the surrounding atmospheric conditions, such as for example the ambient temperature and air pressure, the process medium 10 evaporates to a greater or lesser extent and mixes with the ambient air. In addition, as a result of the relative movement between transport rollers 3a and process medium 10 and rolling processes of the conveyor means 3a on the substrate surface 4, there can also be a detachment of very small process medium droplets present as finely dispersed mist above the liquid level of process medium 10. Admittedly a mixture of gas and/or mist form process medium 10 with the ambient air is typically heavier than the latter, but as a result of the relative movements of conveyor means 3a and substrates 2 there is a whirling up of the ambient air and which, without suction means 11, can bring about a rise of the process medium in gas and/or mist form above transport plane 5.

As a result the process medium 10 in gas and/or mist form can be deposited on the upwardly directed surface of substrate 2. As this is undesired, suction means 11 are provided and are fitted as vacuum-supplied pipes between the transport rollers 3a and in each case have several suction openings 12 through which the gas and/or mist form process medium 10 can be sucked off in an area below transport plane 5 and can consequently not pass beyond said plane 5 onto the upwardly directed substrate surface. Therefore the suction means 11 are arranged vertically below the transport plane 5 and bring about a substantially vertically directed air flow, which is preferably in low turbulence and more especially laminar form.

By means of a drainage pipe 18, the suction means 11 are connected to a suction line 18, which is supplied with a vacuum by a not shown pumping device. For the individual setting of suction means 11, between the drainage pipe 17 and suction line 18 a setting valve 19 is provided and is constructed as a throttle valve and makes it possible to influence a volume flow exhausted by suction line 18.

For a particularly compact arrangement of suction means 11 in device 1, a median longitudinal axis 21 of the tubular suction means 11 is oriented parallel to a rotation axis 20 of transport rollers 3a and suction means 11 is placed in a gap defined by transport rollers 3a and transport surface 5, as well as in the downwards direction by the liquid level of process medium 10. Thus, despite a limited spacing of transport rollers 3, it is possible to have a large cross-section for suction means 11. Thus, even in the case of high volume flows sucked through suction means 11, a low flow rate can be ensured in suction means 11. In addition, there is also a large outer surface of suction means 11 in which can be made a large number of suction openings 12, so that there is a low turbulence and in particular laminar air flow in the vertical downwards direction, so as to ensure a reliable suction of gaseous or mist-like distributed process medium 10.

The invention claimed is:

1. A method for wetting a substrate surface of substrates with a liquid process medium comprising the following steps:
    transporting a plurality of discrete substrates with a plurality of transport means in a transport plane, the transport plane being substantially horizontal;
    wetting a downwardly directed underside surface of each said substrate positioned at least substantially in said transport plane with said process medium, wherein said process medium is applied to said underside substrate surfaces by said transport means; and
    suctioning off a mist, vapor, or gas form of said liquid process medium arising from said liquid process medium, the suctioning taking place with a plurality of suction means located in a vicinity of a tank filled with said liquid process means,
    said suction means arranged vertically below said transport plane in order to prevent a deposition of said process medium on surfaces of each said substrate other than said downwardly directed underside substrate surface located in said transport plane, said suction means being interposed between said plurality of transport means.

2. The method according to claim 1, wherein a continuous transportation of said substrates is provided.

3. The method according to claim 1, wherein a continuous provision of said process medium by said conveyor for wetting said underside substrate surfaces is provided.

4. The method according to claim 1, wherein a continuous suction of said process medium in gas, vapor, or mist form is provided.

* * * * *